United States Patent
Kato

(10) Patent No.: US 9,673,501 B2
(45) Date of Patent: Jun. 6, 2017

(54) LAMINATED FLAT CABLE AND METHOD FOR PRODUCING SAME

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 222 days.

(21) Appl. No.: 14/521,533

(22) Filed: Oct. 23, 2014

(65) Prior Publication Data

US 2015/0042421 A1    Feb. 12, 2015

Related U.S. Application Data

(63) Continuation of application No. PCT/JP2013/066209, filed on Jun. 12, 2013.

(30) Foreign Application Priority Data

Jun. 29, 2012  (JP) .................................. 2012-147306

(51) Int. Cl.
*H01P 3/08* (2006.01)
*H01P 3/00* (2006.01)
(Continued)

(52) U.S. Cl.
CPC .............. *H01P 3/003* (2013.01); *B32B 37/02* (2013.01); *B32B 37/12* (2013.01); *B32B 38/04* (2013.01);
(Continued)

(58) Field of Classification Search
CPC .. H01P 3/08; H01P 3/087; H01P 3/088; H01P 3/085
(Continued)

(56) References Cited

U.S. PATENT DOCUMENTS 5,701,128 A    12/1997 Okada et al.
6,414,573 B1 *  7/2002 Swineford .............. H01P 3/087
                                                                  333/238
(Continued)

FOREIGN PATENT DOCUMENTS

JP    03-009502 U    1/1991
JP    08-242117 A    9/1996
(Continued)

OTHER PUBLICATIONS

Official Communication issued in corresponding Japanese Patent Application No. 2014-522525, mailed on Mar. 10, 2015.
(Continued)

*Primary Examiner* — Stephen E Jones
(74) *Attorney, Agent, or Firm* — Keating & Bennett, LLP

(57) ABSTRACT

A laminated flat cable includes a laminate, a signal line for high-frequency signal transmission, a reference ground conductor, and an auxiliary ground conductor. The laminate includes a first base layer with first and second principal surfaces and a second base layer with third and fourth principal surfaces, and the second principal surface is opposed to the third principal surface. The signal line is located on the second principal surface. The reference ground conductor is located on the first principal surface and is opposite to the signal line. The auxiliary ground conductor is located on the third or fourth principal surface and is opposite to the signal line. The auxiliary ground conductor includes a plurality of openings arranged along the signal line.

11 Claims, 13 Drawing Sheets

(51) Int. Cl.
*B32B 37/02* (2006.01)
*B32B 37/12* (2006.01)
*B32B 38/04* (2006.01)
*H01P 11/00* (2006.01)
*H01P 5/02* (2006.01)
*H05K 1/02* (2006.01)
*H05K 1/14* (2006.01)

(52) U.S. Cl.
CPC ............ *H01P 3/085* (2013.01); *H01P 11/003* (2013.01); *H05K 1/028* (2013.01); *H05K 1/0242* (2013.01); *H05K 1/0253* (2013.01); *B32B 2038/042* (2013.01); *B32B 2307/204* (2013.01); *B32B 2457/00* (2013.01); *H01P 5/028* (2013.01); *H05K 1/0221* (2013.01); *H05K 1/0225* (2013.01); *H05K 1/147* (2013.01); *H05K 2201/0969* (2013.01); *H05K 2201/09618* (2013.01); *H05K 2201/09727* (2013.01)

(58) Field of Classification Search
USPC .................................................. 333/238, 246
See application file for complete search history.

(56) References Cited

U.S. PATENT DOCUMENTS

| | | | | |
|---|---|---|---|---|
| 2005/0237136 A1* | 10/2005 | Nakatsuka | ............ | H01P 3/081 333/238 |
| 2012/0097433 A1* | 4/2012 | Kato | ............ | H01P 3/081 174/254 |
| 2013/0127560 A1 | 5/2013 | Kato et al. | | |

FOREIGN PATENT DOCUMENTS

| JP | 2007-123740 A | | 5/2007 | |
|---|---|---|---|---|
| JP | 3173143 U | | 1/2012 | |
| WO | WO2011/007660 | * | 1/2011 | ............ H01P 3/08 |
| WO | 2012/074100 A1 | | 6/2012 | |

OTHER PUBLICATIONS

Official Communication issued in International Patent Application No. PCT/JP2013/066209, mailed on Sep. 10, 2013.

* cited by examiner

F I G. 1
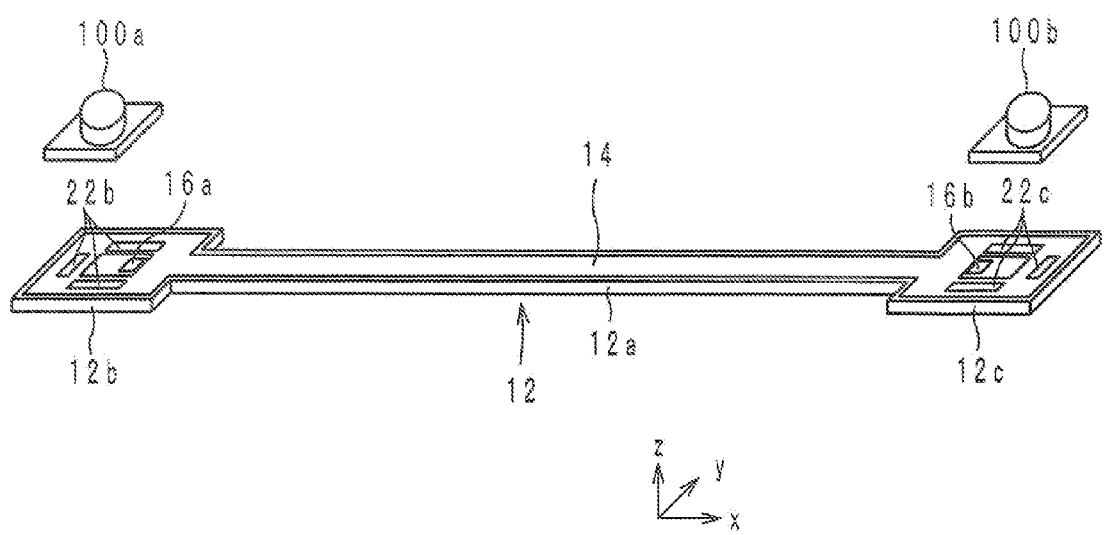

F I G. 4
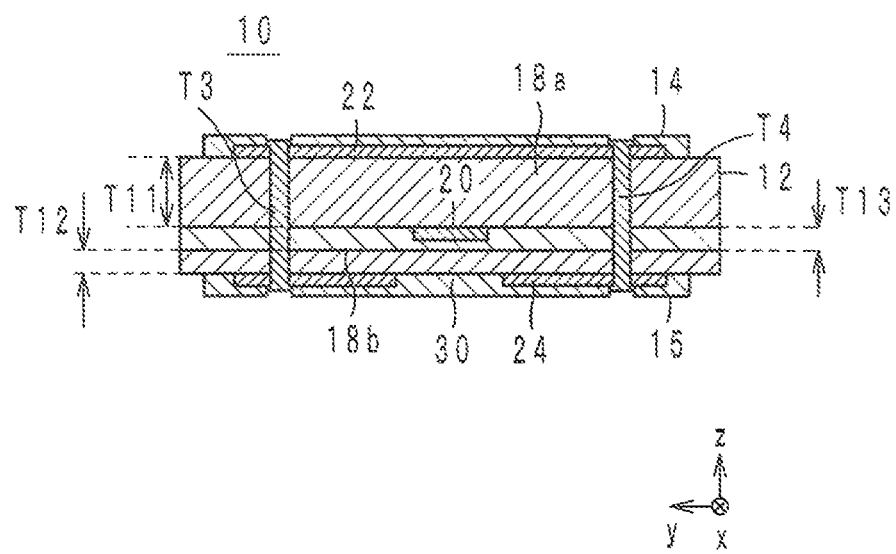
F I G. 5
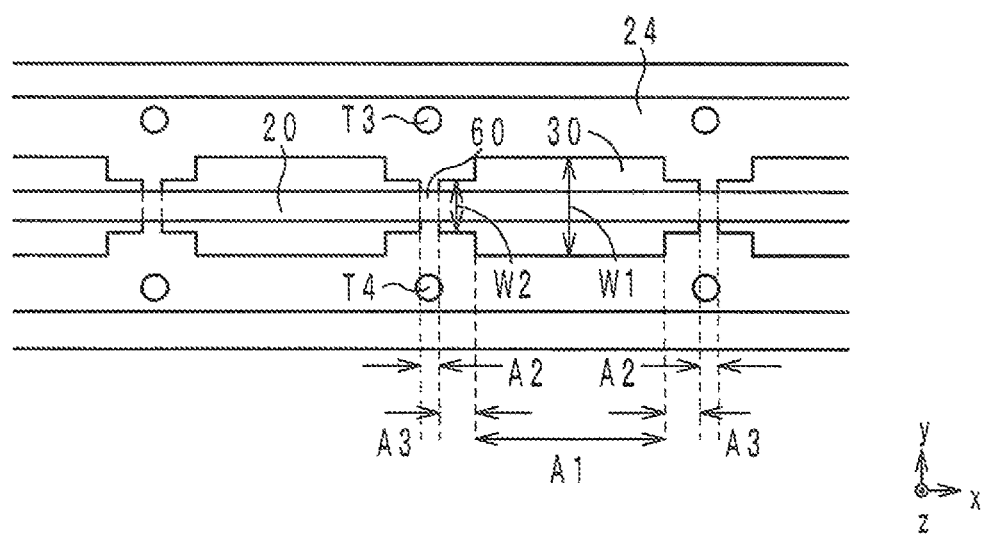

F I G. 11
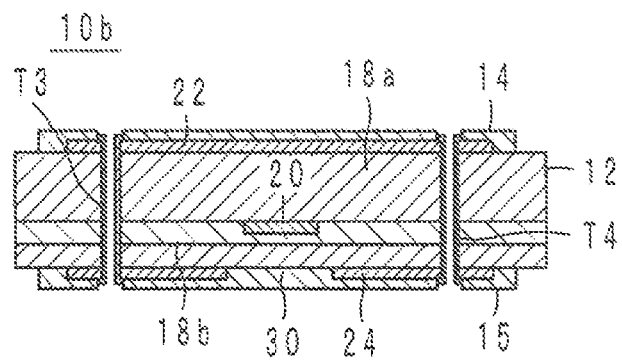
F I G. 12
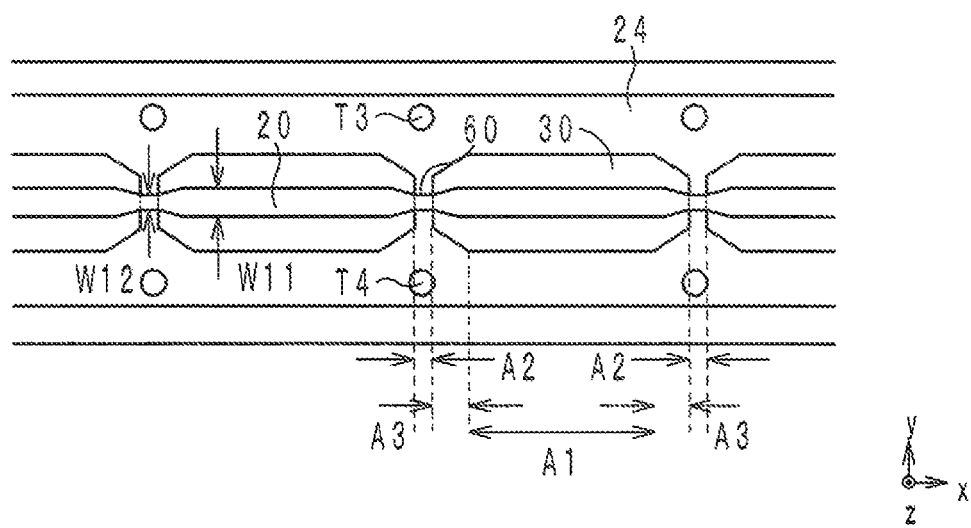

FIG. 13
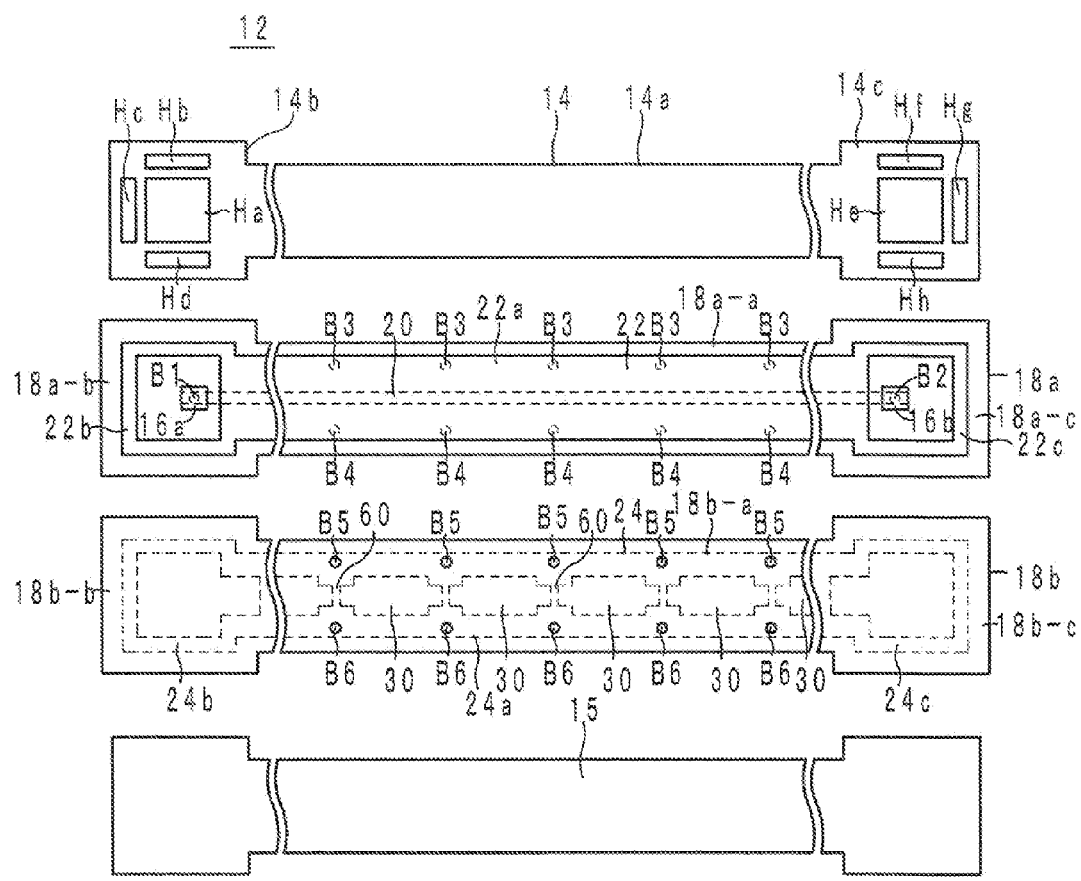

LAMINATED FLAT CABLE AND METHOD FOR PRODUCING SAME

This application is based on Japanese Patent Application No. 2012-147306 filed on Jun. 29, 2012, and International Application No. PCT/JP2013/066209 filed on Jun. 12, 2013, the entire contents of each of which is incorporated herein by reference.

BACKGROUND OF THE INVENTION

1. Field of the Invention

The present invention relates to laminated flat cables and methods for producing the same, and more particularly, the present invention relates to a laminated flat cable for use in high-frequency signal transmission and a method for producing the same.

2. Description of the Related Art

As a conventional laminated flat cable, a high-frequency signal line described in, for example, Japanese Utility Model No. 3173143 is known. FIG. 14 is an exploded view of the high-frequency signal line 500 described in Japanese Utility Model No. 3173143.

The signal line 500 shown in FIG. 14 includes a dielectric element assembly 512, a ground conductor 530, a signal line 532, and an auxiliary ground conductor 534. The dielectric element assembly 512 is formed by laminating dielectric sheets 522a to 522c in this order.

The signal line 532 is provided on the dielectric sheet 522b. The ground conductor 530 is provided on the dielectric sheet 522a so as to be opposite to the signal line 532 with the dielectric sheet 522a positioned therebetween. Moreover, the ground conductor 530 has a plurality of openings 540 overlapping with the signal line 532.

The ground conductor 534 is provided on the dielectric sheet 522c so as to be opposite to the signal line 532 with the dielectric sheet 522b positioned therebetween.

In the signal line 500 thus configured, since the ground conductor 530 has the openings 540 provided therein, less capacitance is generated between the ground conductor 530 and the signal line 532. Accordingly, even if the distance between the ground conductor 530 and the signal line 532 in the direction of lamination is reduced, the capacitance generated therebetween is inhibited from becoming excessively high and thus causing the characteristic impedance of the signal line 532 from deviating from a desired impedance value. Thus, the signal line 500 allows the dielectric element assembly 512 to be reduced in thickness.

However, in the signal line 500 described in Japanese Utility Model No. 3173143, there might be variability in characteristic impedance of the signal line 532, as will be described below. More specifically, in the signal line 500, the ground conductor 530 is a conductor having the openings 540 provided therein, and the ground conductor 534 is a conductor in the form of a solid without openings. At the time of designing the signal line 500, the distance between the signal line 532 and the ground conductor 534 is decided such that the characteristic impedance of the signal line 532 is higher than a predetermined impedance value (e.g., 50Ω) in a state where the ground conductor 534 is present but the ground conductor 530 is not present. Thereafter, the shape of the opening 540 in the ground conductor 530 and the distance between the signal line 532 and the ground conductor 530 are decided such that the characteristic impedance of the signal line 532 has a predetermined impedance value (e.g., 50Ω) in a state where the ground conductor 530 is added.

Here, in the state where the ground conductor 534 is present but the ground conductor 530 is not present, the characteristic impedance of the signal line 532 is determined by the distance between the signal line 532 and the ground conductor 534. Therefore, the signal line 500 is required to be produced such that the distance between the signal line 532 and the ground conductor 534 satisfies the range of design values.

However, the signal line 532 is provided on the dielectric sheet 522b, whereas the ground conductor 534 is provided on the dielectric sheet 522c. Accordingly, the distance between the signal line 532 and the ground conductor 534 might be out of the range of design values if the dielectric sheets 522b and 522c are not laminated in such a manner as to contact evenly with each other. As a result, there might be variability in characteristic impedance of the signal line 532.

SUMMARY OF THE INVENTION

A preferred embodiment of the present invention is directed to a laminated flat cable including a laminate, a signal line for high-frequency signal transmission, a reference ground conductor, and an auxiliary ground conductor. The laminate is includes a first base layer including first and second principal surfaces and a second base layer including third and fourth principal surfaces, and the second principal surface is opposed to the third principal surface. The signal line is located on the second principal surface. The reference ground conductor is located on the first principal surface and is opposite to the signal line. The auxiliary ground conductor is located on the third or fourth principal surface and is opposite to the signal line. The auxiliary ground conductor includes a plurality of openings arranged along the signal line.

Another preferred embodiment of the present invention is directed to a method for producing a laminated flat cable, including a first step of forming a reference ground conductor on a first principal surface of a first base layer, a second step of forming a signal line on a second principal surface of the first base layer so as to overlap with the reference ground conductor when viewed in a plan view in a direction normal to the second principal surface, a third step of forming an auxiliary ground conductor with a plurality of openings on a third or fourth principal surface of a second base layer, and a fourth step of laminating the first base layer and the second base layer, such that the openings are positioned along the signal line, and the second and third principal surfaces are opposed to each other.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external oblique view of a laminated flat cable according to a preferred embodiment of the present invention.

FIG. 4 is another cross-sectional structure view of the laminated flat cable in FIG. 1.

FIG. 5 is a plan view of a signal line and an auxiliary ground conductor of the laminated flat cable as seen in the direction of lamination.

FIG. 11 is a cross-sectional structure view of a laminated flat cable according to a second modification of a preferred embodiment of the present invention.

FIG. 12 is a plan view of a signal line and an auxiliary ground conductor of a laminated flat cable according to a third modification of a preferred embodiment of the present invention.

FIG. 13 is an exploded view of a dielectric element assembly of a laminated flat cable according to a fourth modification of a preferred embodiment of the present invention.

DETAILED DESCRIPTION OF THE PREFERRED EMBODIMENTS

Hereinafter, laminated flat cables according to preferred embodiments of the present invention, along with methods for producing the same, will be described with reference to the drawings.

Figure 2:
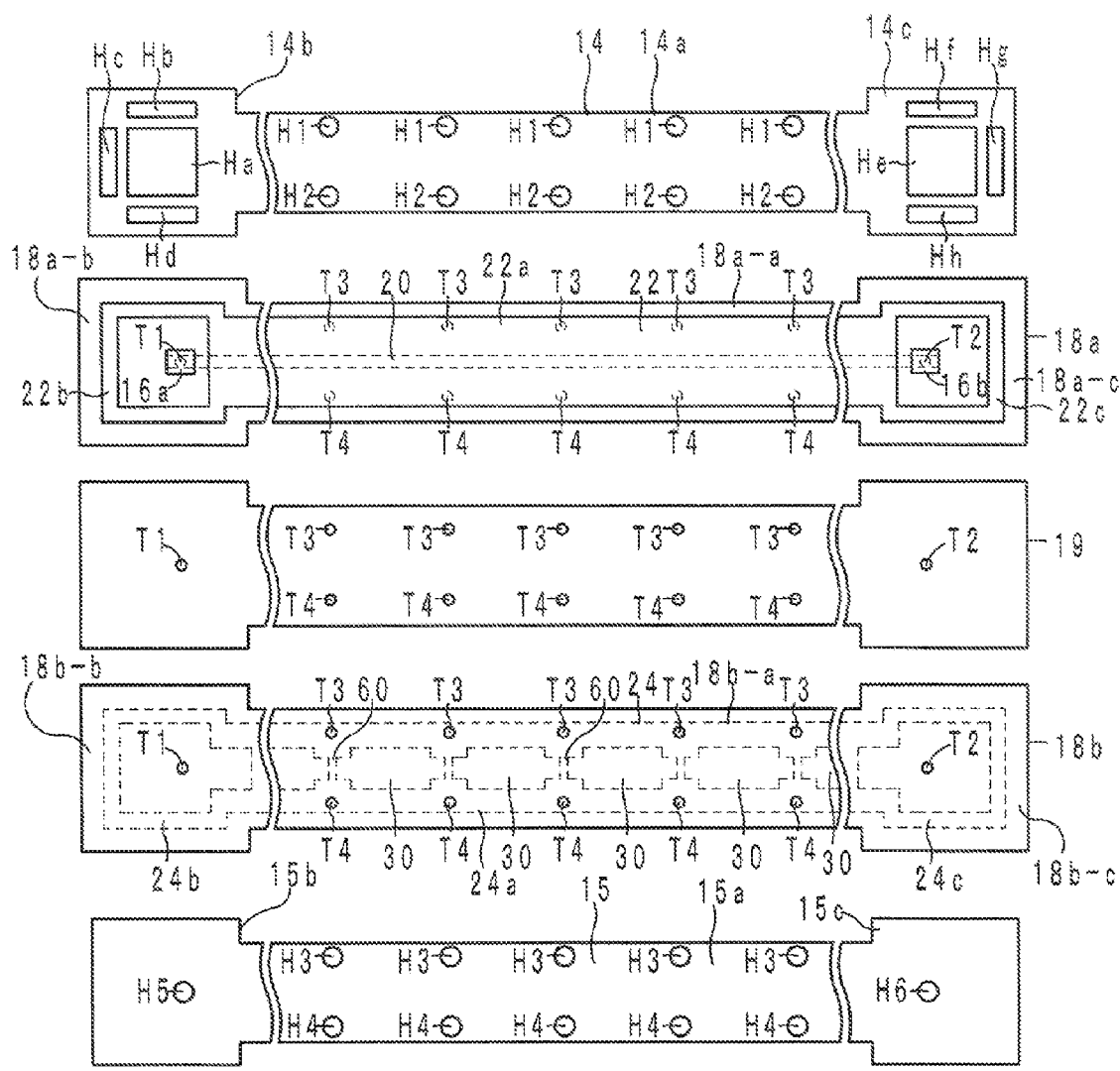
FIG. 2 is an exploded view of a dielectric element assembly of the laminated flat cable in FIG. 1.
Figure 3:
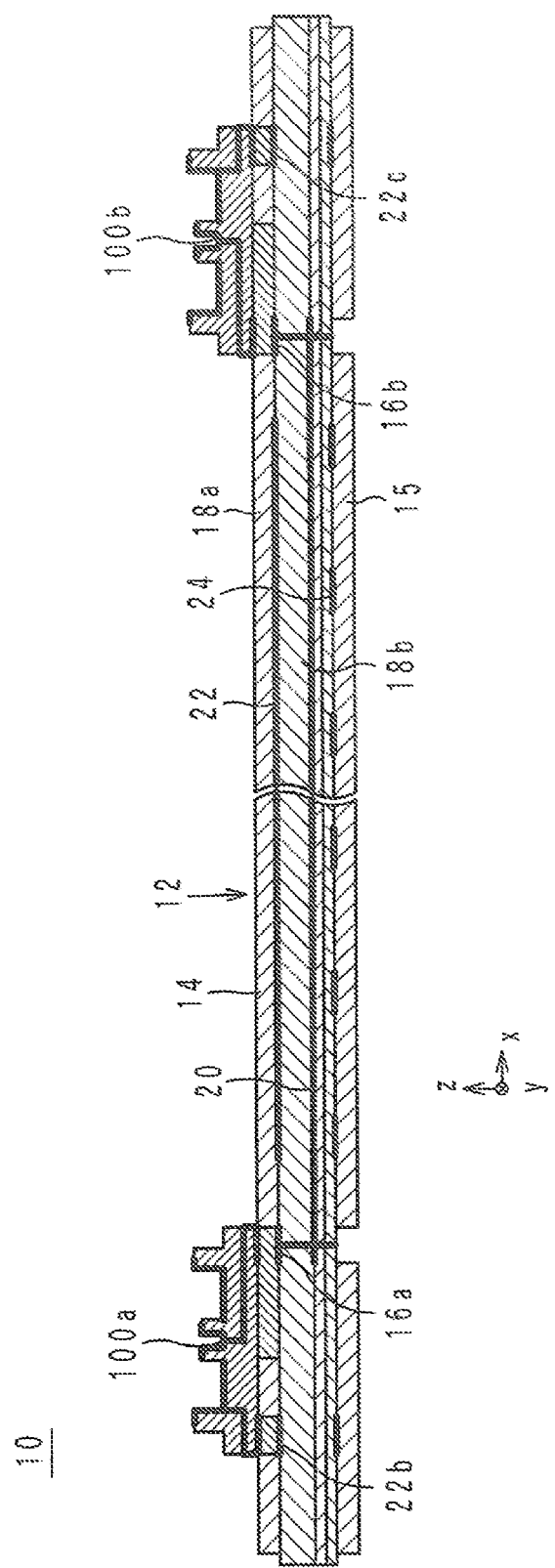
FIG. 3 is a cross-sectional structure view of the laminated flat cable in FIG. 1.

The configuration of the laminated flat cable according to a preferred embodiment will be described below with reference to the drawings. FIG. 1 is an external oblique view of the laminated flat cable 10 according to the present preferred embodiment. FIG. 2 is an exploded view of a dielectric element assembly 12 of the laminated flat cable 10 in FIG. 1. FIG. 3 is a cross-sectional structure view of the laminated flat cable 10 in FIG. 1. FIG. 4 is another cross-sectional structure view of the laminated flat cable 10 in FIG. 1. FIG. 5 is a plan view of a signal line 20 and an auxiliary ground conductor 24 of the laminated flat cable 10 as seen in the direction of lamination. In FIGS. 1 through 5, the direction of lamination of the laminated flat cable 10 will be defined as a z-axis direction. In addition, the longitudinal direction of the laminated flat cable 10 will be defined as an x-axis direction, and the direction perpendicular to the x-axis and z-axis directions will be defined as a y-axis direction.

The laminated flat cable 10 is preferably used in, for example, an electronic device such as a cell phone to connect two high-frequency circuits. The laminated flat cable 10 includes the dielectric element assembly 12, external terminals 16 (16a and 16b), the signal line 20, a reference ground conductor 22, the auxiliary ground conductor 24, through-hole conductors T1 to T4, and connectors 100a and 100b, as shown in FIGS. 1 through 3.

The dielectric element assembly 12 is a flexible plate-shaped member extending in the x-axis direction when viewed in a plan view in the z-axis direction, and includes a line portion 12a and connecting portions 12b and 12c, as shown in FIG. 1. The dielectric element assembly 12 is a laminate including a protective layer 14, a dielectric sheet 18a, an adhesive layer 19, a dielectric sheet 18b, and a protective layer 15 laminated on each other in this order, from the positive side to the negative side in the z-axis direction, as shown in FIG. 2. In the following, the principal surface of the dielectric element assembly 12 that is located on the positive side in the z-axis direction will be referred to as a top surface, and the principal surface of the dielectric element assembly 12 that is located on the negative side in the z-axis direction will be referred to as a bottom surface.

The line portion 12a extends in the x-axis direction, as shown in FIG. 2. The connecting portion 12b is preferably in the form of a rectangle connected to the end of the line portion 12a on the negative side in the x-axis direction. The connecting portion 12c is preferably in the form of a rectangle connected to the end of the line portion 12a on the positive side in the x-axis direction. The width of each of the connecting portions 12b and 12c in the y-axis direction is greater than the width of the line portion 12a in the y-axis direction.

The dielectric sheets 18a and 18b, when viewed in a plan view in the z-axis direction, extend in the x-axis direction and have the same shape as the dielectric element assembly 12, as shown in FIG. 2. The dielectric sheets 18a and 18b are preferably made of a flexible thermoplastic resin such as polyimide or liquid crystal polymer. In the following, the principal surface of the dielectric sheet 18a that is located on the positive side in the z-axis direction will be referred to as a top surface (first principal surface), and the principal surface of the dielectric sheet 18a that is located on the negative side in the z-axis direction will be referred to as a bottom surface (second principal surface). The principal surface of the dielectric sheet 18b that is located on the positive side in the z-axis direction will be referred to as a top surface (third principal surface), and the principal surface of the dielectric sheet 18b that is located on the negative side in the z-axis direction will be referred to as a bottom surface (fourth principal surface).

The dielectric sheets 18a and 18b are laminated such that the bottom surface of the dielectric sheet 18a and the top surface of the dielectric sheet 18b are opposed to each other. However, the adhesive layer 19 is interposed between the bottom surface of the dielectric sheet 18a and the top surface of the dielectric sheet 18b.

The thickness T11 of the dielectric sheet 18a is greater than the thickness T12 of the dielectric sheet 18b, as shown in FIG. 4. After the lamination of the dielectric sheets 18a and 18b, the thickness T11 preferably is, for example, from about 50 µm to about 300 µm. In the present preferred embodiment, the thickness T11 preferably is about 100 µm, for example. The thickness T12 preferably is, for example, from about 10 µm to about 100 µm. In the present preferred embodiment, the thickness T12 preferably is about 25 µm, for example.

Furthermore, the dielectric sheet 18a includes a line portion 18a-a and connecting portions 18a-b and 18a-c. The dielectric sheet 18b includes a line portion 18b-a and connecting portions 18b-b and 18b-c. The line portions 18a-a and 18b-a constitute the line portion 12a. The connecting portions 18a-b and 18b-b constitute the connecting portion 12b. The connecting portions 18a-c and 18b-c constitute the connecting portion 12c.

The adhesive layer 19, when viewed in a plan view in the z-axis direction, extends in the x-axis direction and has the same shape as the dielectric element assembly 12, as shown in FIG. 2. The adhesive layer 19 is a layer of, for example, a resin adhesive made of polyimide or vinyl acetate, and bonds the bottom surface of the dielectric sheet 18a and the top surface of the dielectric sheet 18b. After the lamination of the dielectric sheets 18a and 18b, the thickness T13 of the adhesive layer 19 (see FIG. 4) preferably is, for example, from about 10 μm to about 50 μm. In the present preferred embodiment, the thickness T13 preferably is about 25 μm, for example. The thickness T11 is greater than the total of the thickness T12 and the thickness T13, as shown in FIG. 4.

The signal line 20 is a linear conductor provided on the bottom surface of the dielectric sheet 18a for the purpose of high-frequency signal transmission, as shown in FIG. 2. The signal line 20 extends through the line portion 18a-a in the x-axis direction. The end of the signal line 20 that is located on the negative side in the x-axis direction is positioned essentially at the center of the connecting portion 18a-b. The end of the signal line 20 that is located on the positive side in the x-axis direction is positioned essentially at the center of the connecting portion 18a-c. The signal line 20 transmits a high-frequency signal therethrough. The signal line 20 preferably has a width of, for example, from about 100 μm to about 500 μm. In the present preferred embodiment, the width of the signal line 20 preferably is about 300 μm, for example. The signal line 20 is preferably made of a metal material including silver or copper and having a low specific resistance. Here, the signal line 20 is located on the bottom surface of the dielectric sheet 18a preferably by patterning metal foil formed preferably by plating the bottom surface of the dielectric sheet 18a or preferably by patterning metal foil attached to the bottom surface of the dielectric sheet 18a. Moreover, the top surface of the signal line 20 is smoothened, so that surface roughness of the signal line 20 is greater on the side that contacts the dielectric sheet 18a than on the side that does not contact the dielectric sheet 18a.

The reference ground conductor 22 is provided on the top surface of the dielectric sheet 18a so as to be opposite to the signal line 20 with the dielectric sheet 18a positioned therebetween, as shown in FIG. 2. More specifically, the reference ground conductor 22 is a conductor provided in the form of a solid without openings and extending in the x-axis direction on the top surface of the dielectric sheet 18a. The reference ground conductor 22 is preferably made of a metal material including silver or copper and having a low specific resistance. Here, the reference ground conductor 22 is formed on the top surface of the dielectric sheet 18a preferably by patterning metal foil formed preferably by plating the top surface of the dielectric sheet 18a or preferably by patterning metal foil attached to the top surface of the dielectric sheet 18a. Moreover, the top surface of the reference ground conductor 22 is smoothened, so that surface roughness of the reference ground conductor 22 is greater on the side that contacts the dielectric sheet 18a than on the side that does not contact the dielectric sheet 18a.

Furthermore, the reference ground conductor 22 includes a line portion 22a and terminal portions 22b and 22c. The line portion 22a is provided on the top surface of the line portion 18a-a and extends in the x-axis direction. The terminal portion 22b is preferably provided in the form of a rectangular frame on the top surface of the line portion 18a-b. The terminal portion 22b is connected to the end of the line portion 22a on the negative side in the x-axis direction. The terminal portion 22c is preferably provided in the form of a rectangular frame on the top surface of the line portion 18a-c. The terminal portion 22c is connected to the end of the line portion 22a on the positive side in the x-axis direction.

The auxiliary ground conductor 24 is provided on the bottom surface of the dielectric sheet 18b so as to be opposite to the signal line 20 with the dielectric sheets 18b and the adhesive layer 19 positioned therebetween, as shown in FIG. 2. More specifically, the auxiliary ground conductor 24 is a conductor extending in the x-axis direction on the bottom surface of the dielectric sheet 18b. The auxiliary ground conductor 24 includes a plurality of openings 30 arranged along the signal line 20. The opening 30 will be described below with reference to the drawings.

The opening 30, when viewed in a plan view in the z-axis direction, preferably has a cross-shaped configuration overlapping with the signal line 20, as shown in FIGS. 2 and 5. More specifically, the opening 30 preferably has a shape obtained by cutting four corners away from a rectangle which is long in the x-axis direction. Accordingly, the width W2 of the opening 30 in the y-axis direction at opposite ends in the x-axis direction is less than the width W1 in the y-axis direction in the middle of the opening 30 aside from the opposite ends in the x-axis direction.

Furthermore, the openings 30 are arranged in a line in the x-axis direction. Accordingly, portions of the auxiliary ground conductor 24 are interposed between the openings 30 adjacent to one another. The portions of the auxiliary ground conductor 24 interposed between the adjacent openings 30 will be referred to as bridge portions 60. Accordingly, the auxiliary ground conductor 24 preferably has a ladder-shaped configuration. Moreover, the signal line 20 overlaps alternatingly with the openings 30 and the bridge portions 60. The signal line 20 extends in the x-axis direction so as to pass through the centers of the openings 30 and the bridge portions 60 in the y-axis direction.

In the following, areas of the laminated flat cable 10 that correspond to the opposite ends of the opening 30 in the x-axis direction will be referred to as areas A3. Moreover, an area of the laminated flat cable 10 that corresponds to the middle portion of the opening 30 aside from the opposite ends in the x-axis direction will be referred to as an area A1. In addition, an area of the laminated flat cable 10 that corresponds to the bridge portion 60 will be referred to as an area A2.

The auxiliary ground conductor 24 is preferably made of a metal material including silver or copper and having a low specific resistance. Here, the auxiliary ground conductor 24 is formed on the bottom surface of the dielectric sheet 18b preferably by patterning metal foil formed preferably by plating the bottom surface of the dielectric sheet 18b or preferably by patterning metal foil attached to the bottom surface of the dielectric sheet 18b. Moreover, the top surface of the auxiliary ground conductor 24 is smoothened, so that surface roughness of the auxiliary ground conductor 24 is greater on the side that contacts the dielectric sheet 18b than on the side that does not contact the dielectric sheet 18b.

Furthermore, the auxiliary ground conductor 24 includes a line portion 24a and terminal portions 24b and 24c. The line portion 24a is provided on the bottom surface of the line portion 18b-a and extends in the x-axis direction. The terminal portion 24b is preferably provided in the form of a rectangular frame on the bottom surface of the line portion 18b-b. The terminal portion 24b is connected to the end of the line portion 24a on the negative side in the x-axis direction. The terminal portion 24c is preferably provided in the form of a rectangular frame on the bottom surface of the line portion 18b-c. The terminal portion 24c is connected to the end of the line portion 24a on the positive side in the x-axis direction.

The external terminal 16a preferably is a rectangular or substantially rectangular conductor provided essentially at the center on the top surface of the connecting portion 18a-b, as shown in FIGS. 1 and 2. Accordingly, the external terminal 16a, when viewed in a plan view in the z-axis direction, overlaps with the end of the signal line 20 on the negative side in the x-axis direction. The external terminal 16b preferably is a rectangular or substantially rectangular conductor provided essentially at the center on the top surface of the connecting portion 18a-c, as shown in FIGS. 1 and 2. Accordingly, the external terminal 16b, when viewed in a plan view in the z-axis direction, overlaps with the end of the signal line 20 on the positive side in the x-axis direction. The external terminals 16a and 16b are preferably made of a metal material including silver or copper and having a low specific resistance. In addition, the top surfaces of the external terminals 16a and 16b are plated with Ni and Au. Here, the external terminals 16a and 16b are formed on the top surface of the dielectric sheet 18a preferably by patterning metal foil formed preferably by plating the top surface of the dielectric sheet 18a or preferably by patterning metal foil attached to the top surface of the dielectric sheet 18a. Moreover, the top surfaces of the external terminals 16a and 16b are smoothened, so that surface roughness of the external terminals 16a and 16b is greater on the side that contacts the dielectric sheet 18a than on the side that does not contact the dielectric sheet 18a.

In this manner, the signal line 20 is positioned between the reference ground conductor 22 and the auxiliary ground conductor 24. That is, the signal line 20, the reference ground conductor 22, and the auxiliary ground conductor 24 define a tri-plate stripline structure. Moreover, the distance between the signal line 20 and the reference ground conductor 22 preferably is, for example, from about 50 μm to about 300 μm, which is equal or approximately equal to the thickness T11 of the dielectric sheet 18a, as shown in FIG. 4. In the present preferred embodiment, the distance between the signal line 20 and the reference ground conductor 22 preferably is about 175 μm, for example. On the other hand, the distance between the signal line 20 and the auxiliary ground conductor 24 preferably is, for example, from about 10 μm to about 100 μm, which is equal or approximately equal to the total of the thickness T12 of the dielectric sheet 18b and the thickness T13 of the adhesive layer 19, as shown in FIG. 4. In the present preferred embodiment, the distance between the signal line 20 and the auxiliary ground conductor 24 preferably is about 25 μm, for example. That is, the distance between the signal line 20 and the auxiliary ground conductor 24 is designed to be less than the distance between the signal line 20 and the reference ground conductor 22.

The through-hole conductor T1 (inter-layer connecting portion) pierces through the connecting portion 18a-b of the dielectric sheet 18a, the adhesive layer 19, and the connecting portion 18b-b of the dielectric sheet 18b (i.e., the dielectric element assembly 12) in the z-axis direction, and connects the external terminal 16a to the end of the signal line 20 that is located on the negative side in the x-axis direction. The through-hole conductor T2 (inter-layer connecting portion) pierces through the connecting portion 18a-c of the dielectric sheet 18a, the adhesive layer 19, and the connecting portion 18b-c of the dielectric sheet 18b (i.e., the dielectric element assembly 12) in the z-axis direction, and connects the external terminal 16b to the end of the signal line 20 that is located on the positive side in the x-axis direction. Accordingly, the signal line 20 is connected between the external terminals 16a and 16b. The through-hole conductors T1 and T2 are preferably formed by filling through-holes, which are provided in the dielectric element assembly 12, with a metal material through Ni/Au plating.

The through-hole conductors T3 (inter-layer connecting portions) pierce through the line portion 18a-a of the dielectric sheet 18a, the adhesive layer 19, and the line portion 18b-a of the dielectric sheet 18b (i.e., the dielectric element assembly 12) in the z-axis direction, and connect the reference ground conductor 22 and the auxiliary ground conductor 24. The through-hole conductors T3 are positioned on the positive side in the y-axis direction relative to the bridge portions 60, and arranged in a line in the x-axis direction, as shown in FIG. 2. The through-hole conductors T3 preferably are formed by filling through-holes, which are provided in the dielectric element assembly 12, with a metal material through Ni/Au plating.

The through-hole conductors T4 (inter-layer connecting portions) pierce through the line portion 18a-a of the dielectric sheet 18a, the adhesive layer 19, and the line portion 18b-a of the dielectric sheet 18b (i.e., the dielectric element assembly 12) in the z-axis direction, and connect the reference ground conductor 22 and the auxiliary ground conductor 24. The through-hole conductors T4 are positioned on the negative side in the y-axis direction relative to the bridge portions 60, and arranged in a line in the x-axis direction, as shown in FIG. 2. The through-hole conductors T4 are preferably formed by filling through-holes, which are provided in the dielectric element assembly 12, with a metal material through Ni/Au plating.

The protective layer 14 is an insulating film covering approximately the entire top surface of the dielectric sheet 18a. Accordingly, the reference ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers approximately the entire top surface of the line portion 18a-a, including the line portion 22a.

The connecting portion 14b is connected to the end of the line portion 14a on the negative side in the x-axis direction, and covers the top surface of the connecting portion 18a-b. The connecting portion 14b includes openings Ha to Hd provided therein. The opening Ha preferably is a rectangular or substantially rectangular opening provided at the center of the connecting portion 14b. The external terminal 16a is exposed to the outside from the opening Ha. The opening Hb preferably is a rectangular or substantially rectangular opening provided on the positive side in the y-axis direction relative to the opening Ha. The opening Hc preferably is a rectangular or substantially rectangular opening provided on the negative side in the x-axis direction relative to the opening Ha. The opening Hd preferably is a rectangular or substantially rectangular opening provided on the negative side in the y-axis direction relative to the opening Ha. The terminal portion 22b defines and functions as an external terminal because it is exposed to the outside from the openings Hb to Hd.

The connecting portion 14c is connected to the end of the line portion 14a on the positive side in the x-axis direction, and covers the top surface of the connecting portion 18a-c. The connecting portion 14c includes openings He to Hh provided therein. The opening He preferably is a rectangular or substantially rectangular opening provided at the center of the connecting portion 14c. The external terminal 16b is exposed to the outside from the opening He. The opening Hf preferably is a rectangular or substantially rectangular opening provided on the positive side in the y-axis direction relative to the opening He. The opening Hg preferably is a rectangular or substantially rectangular opening provided on the positive side in the x-axis direction relative to the opening He. The opening Hh preferably is a rectangular or substantially rectangular opening provided on the negative side in the y-axis direction relative to the opening He. The terminal portion 22c defines and functions as an external terminal because it is exposed to the outside from the openings Hf to Hh.

Furthermore, the protective layer 14 includes openings H1 and H2 provided in positions respectively corresponding to the through-hole conductors T3 and T4.

The protective layer 15 is an insulating film covering approximately the entire bottom surface of the dielectric sheet 18b. Accordingly, the auxiliary ground conductor 24 including the openings 30 is covered by the protective layer 15. The protective layer 15 is preferably made of, for example, a flexible resin such as a resist material.

Furthermore, the protective layer 15 includes a line portion 15a and connecting portions 15b and 15c, as shown in FIG. 2. The line portion 15a covers approximately the entire bottom surface of the line portion 18b-a, including the line portion 24a.

The connecting portion 15b is connected to the end of the line portion 15a on the negative side in the x-axis direction, and covers the bottom surface of the connecting portion 18b-b. Accordingly, the terminal portion 24b is covered by the connecting portion 15b. The connecting portion 15c is connected to the end of the line portion 15a on the positive side in the x-axis direction, and covers the bottom surface of the connecting portion 18b-c. Accordingly, the terminal portion 24c is covered by the connecting portion 15c.

Furthermore, the protective layer 15 includes openings H5, H6, H3, and H4 provided in positions respectively corresponding to the through-hole conductors T1, T2, T3, and T4.

In the laminated flat cable 10 thus configured, the characteristic impedance of the signal line 20 between two adjacent bridge portions 60 increases in the order: minimum value Z2, intermediate value Z3, and maximum value Z1, and thereafter, decreases in the order: maximum value Z1, intermediate value Z3, and minimum value Z2. More specifically, the opening 30 has the width W1 in the area A1, and also has the width W2 in the area A3, which is less than the width W1, as shown in FIG. 5. Accordingly, the distance between the signal conductor 20 and the auxiliary ground conductor 24 is greater in the area A1 than in the area A3. Therefore, the intensity of a magnetic field generated in the signal conductor 20 is higher in the area A1 than in the area A3, resulting in a higher inductance component in the area A1. That is, inductance (L) property is dominant in the area A1.

Furthermore, the bridge portion 60 is provided in the area A2. Accordingly, the distance between the signal line 20 and the auxiliary ground conductor 24 is greater in the area A3 than in the area A2. Accordingly, the capacitance generated in the signal line 20 is greater in the area A2 than in the area A3. In addition, the intensity of a magnetic field is lower in the area A2 than in the area A3. That is, capacitance (C) property is dominant in the area A2.

Here, the characteristic impedance of the signal line 20 increases when inductance (L) property is dominant, and the characteristic impedance of the signal line 20 decreases when capacitance (C) property is dominant. Accordingly, the characteristic impedance of the signal line 20 has the maximum value Z1 (e.g., about 70Ω) in the area A1. Moreover, the characteristic impedance of the signal line 20 has the intermediate value Z3 (e.g., about 55Ω) in the area A3. In addition, the characteristic impedance of the signal line 20 has the minimum value Z2 (e.g., about 30Ω) in the area A2. The signal line 20 overlaps alternatingly with the openings 30 and the bridge portions 60. Accordingly, the characteristic impedance of the signal line 20 fluctuates cyclically. The characteristic impedance of the entire laminated flat cable 10 has a predetermined impedance value (e.g., about 50Ω).

Figure 6A:
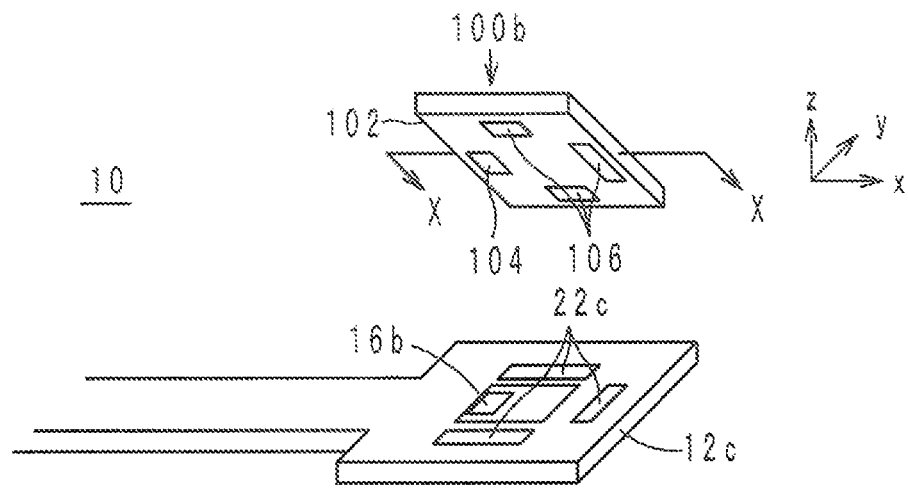
FIG. 6A is an external oblique view of a connector of the laminated flat cable.
Figure 6B:
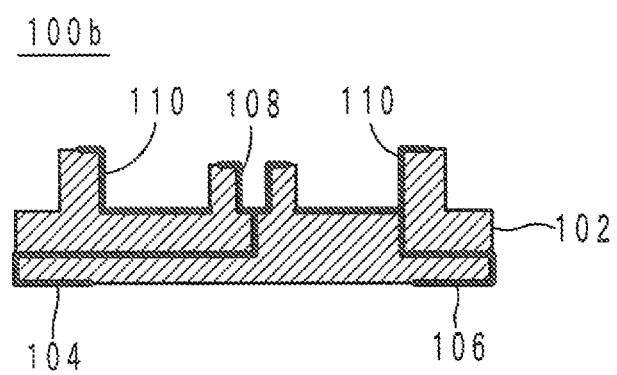
FIG. 6B is a cross-sectional structure view of the connector.

The connectors 100a and 100b are mounted on the top surfaces of the connecting portions 12b and 12c, respectively, as shown in FIG. 1. The connectors 100a and 100b have the same configuration, and therefore, only the configuration of the connector 100b will be described below as an example. FIG. 6A is an external oblique view of the connector 100b of the laminated flat cable 10. FIG. 6B is a cross-sectional structure view of the connector 100b.

The connector 100b includes a connector body 102, external terminals 104 and 106, a center conductor 108, and an external conductor 110, as shown in FIGS. 1, 6A, and 6B. The connector body 102 includes a rectangular or substantially rectangular plate and a cylindrical or substantially cylindrical portion coupled thereon, and is made of an insulating material such as resin.

The external terminal 104 is positioned on the plate of the connector body 102 on the negative side in the z-axis direction, so as to face the external terminal 16b. The external terminal 106 is positioned on the plate of the connector body 102 on the negative side in the z-axis direction, so as to correspond to the portions of the terminal portion 22c exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b thus configured is mounted on the top surface of the connecting portion 12c, such that the external terminal 104 is connected to the external terminal 16b, and the external terminal 106 is connected to the terminal portion 22c, as shown in FIGS. 3, 6A, and 6B. As a result, the signal line 20 is electrically connected to the center conductor 108. In addition, the reference ground conductor 22 and the auxiliary ground conductor 24 are electrically connected to the external conductor 110.

Figure 7A:
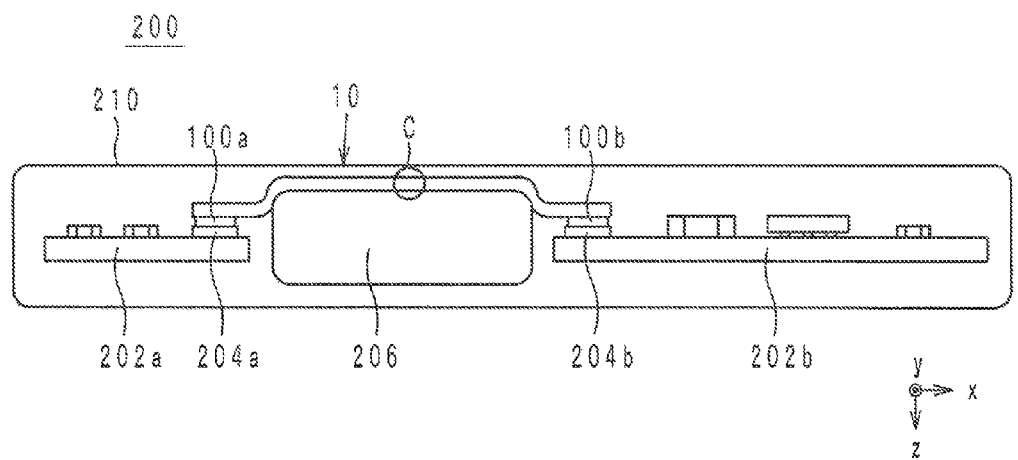
FIG. 7A illustrates an electronic device provided with the laminated flat cable as viewed in a plan view in the y-axis direction.
Figure 7B:
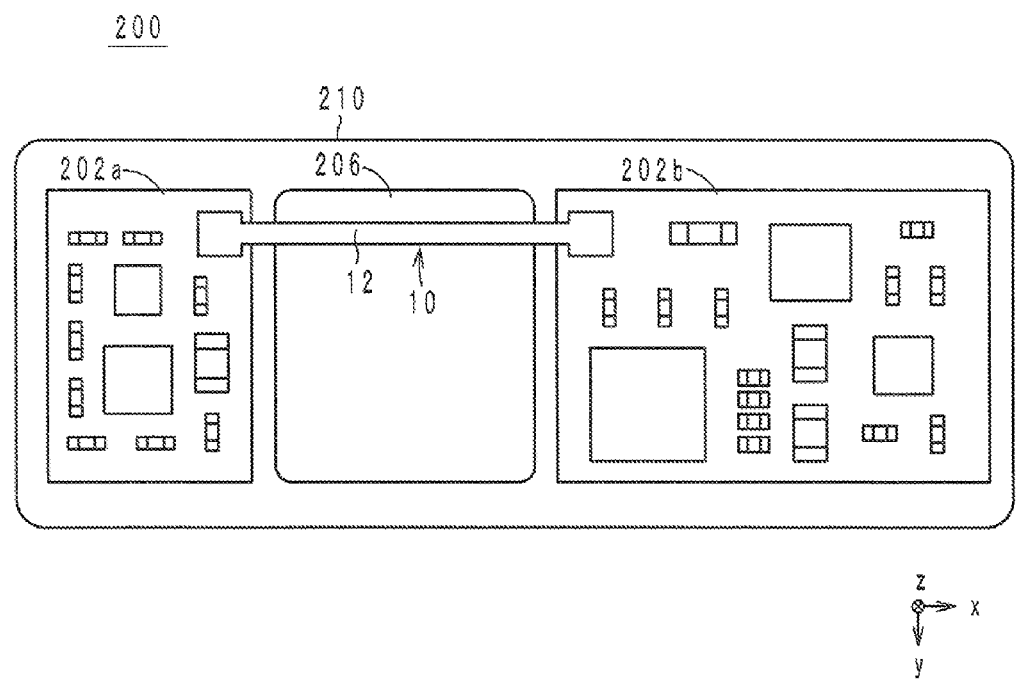
FIG. 7B illustrates the electronic device provided with the laminated flat cable as viewed in a plan view in the z-axis direction.
Figure 8:
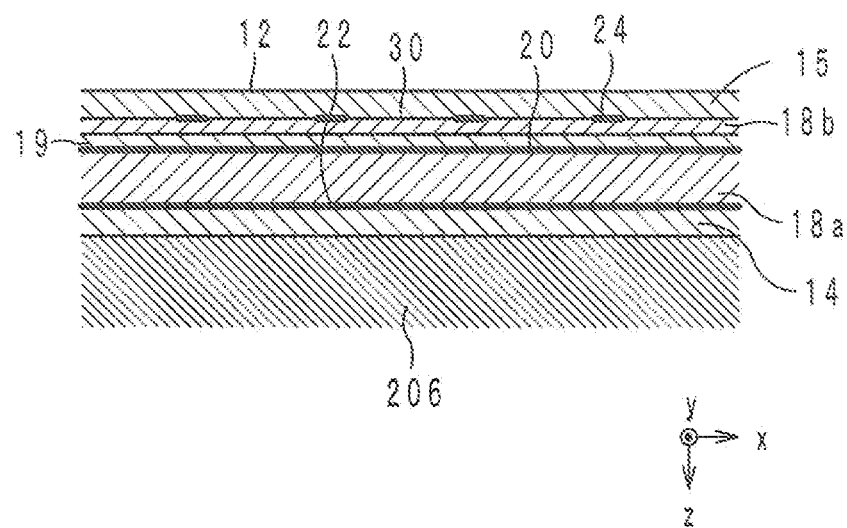
FIG. 8 is a cross-sectional structure view illustrating a circled portion C in FIG. 7A.

The laminated flat cable 10 is used in a manner as will be described below. FIG. 7A illustrates an electronic device 200 provided with the laminated flat cable 10 as viewed in a plan view in the y-axis direction. FIG. 7B illustrates the electronic device 200 provided with the laminated flat cable 10 as viewed in a plan view in the z-axis direction. FIG. 8 is a cross-sectional structure view illustrating a circled portion C in FIG. 7A.

The electronic device 200 includes the laminated flat cable 10, circuit boards 202a and 202b, receptacles 204a and 204b, a battery pack (metallic body) 206, and a housing 210.

The circuit board 202a is provided with, for example, a transmission or reception circuit including an antenna. The circuit board 202b is provided with, for example, a feed circuit. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, 2 GHz are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the laminated flat cable 10 connects the circuit boards 202a and 202b.

Here, the top surface of the dielectric element assembly 12 (more precisely, the protective layer 14) is in contact with the battery pack 206, as shown in FIG. 8. The dielectric element assembly 12 and the battery pack 206 are fixed by an adhesive or other suitable material or device. The top surface of the dielectric element assembly 12 is the principal surface that is located on the side of the reference ground conductor 22 relative to the signal line 20. Accordingly, the reference ground conductor 22, which is preferably in the form of a solid having no openings (and extending in the x-axis direction without interruptions), is positioned between the signal line 20 and the battery pack 206.

A non-limiting example of a method for producing the laminated flat cable 10 will be described below with reference to FIGS. 2, 9A, 9B, 9C, 9D, and 9E. FIGS. 9A, 9B, 9C, 9D, and 9E are cross-sectional views for the production steps for the laminated flat cable 10. While the following description focuses on one laminated flat cable 10 as an example, in actuality, large-sized dielectric sheets are laminated and cut, so that a plurality of laminated flat cables 10 are produced at the same time.

Prepared first is a dielectric sheet 18a made of a thermoplastic resin and copper-foiled entirely on both the top and bottom surfaces. More specifically, copper foil is attached to the top and bottom surfaces of the dielectric sheet 18a. Moreover, copper foil is attached to the bottom surface of the dielectric sheet 18b as well. Further, the copper-foiled top surfaces of the dielectric sheets 18a and 18b are smoothened, for example, by galvanization for rust prevention. The dielectric sheets 18a and 18b are sheets of liquid crystal polymer. The thickness of the copper foil is preferably from about 10 μm to about 20 μm.

Next, external terminals 16a and 16b and a reference ground conductor 22, as shown in FIG. 2, are formed on the top surface of the dielectric sheet 18a by patterning the copper foil on the top surface of the dielectric sheet 18a. More specifically, resists are printed on the copper foil of the dielectric sheet 18a in the same shapes as the external terminals 16a and 16b and the reference ground conductor 22 shown in FIG. 2. Then, any portions of the copper foil that are not coated with the resists are removed by etching the copper foil. Thereafter, the resists are removed by spraying a resist solvent. In this manner, the external terminals 16a and 16b and the reference ground conductor 22, as shown in FIG. 2, are formed on the top surface of the dielectric sheet 18a by photolithography.

Next, the copper foil on the bottom surface of the dielectric sheet 18a is patterned using the external terminals 16a and 16b as positioning markers or using the reference ground conductor 22 as a positioning marker, thus forming a signal line 20, as shown in FIG. 2, on the bottom surface of the dielectric sheet 18a. More specifically, a resist is printed on the copper foil on the bottom surface of the dielectric sheet 18a in the same shape as the signal line 20 shown in FIG. 2, using the external terminals 16a and 16b as positioning markers or using the reference ground conductor 22 as a positioning marker. Then, any portions of the copper foil that are not coated with the resist are removed by etching the copper foil. Thereafter, the resist is removed. In this manner, the signal line 20, as shown in FIG. 2, is formed on the bottom surface of the dielectric sheet 18a by photolithography. Note that the external terminals 16a and 16b and the reference ground conductor 22 may be formed at the same time as the signal line 20 by the same step. Alternatively, after the signal line 20 is formed, the signal line 20 may be used as a positioning marker to form the external terminals 16a and 16b and the reference ground conductor 22.

Next, the copper foil on the bottom surface of the dielectric sheet 18b is patterned, thus forming an auxiliary ground conductor 24, as shown in FIG. 2, on the bottom surface of the dielectric sheet 18b. More specifically, a resist is printed on the copper foil on the bottom surface of the dielectric sheet 18b in the same shape as the auxiliary ground conductor 24 shown in FIG. 2. Then, any portions of the copper foil that are not coated with the resist are removed by etching the copper foil. Thereafter, the resist is removed. In this manner, the auxiliary ground conductor 24, as shown in FIG. 2, is formed on the bottom surface of the dielectric sheet 18b by photolithography.

Figure 9A:
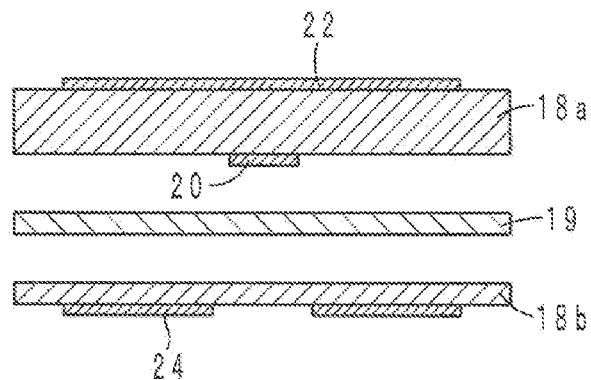
FIGS. 9A, 9B, 9C, 9D, and 9E are cross-sectional views for the production steps for the laminated flat cable.
Figure 9B:
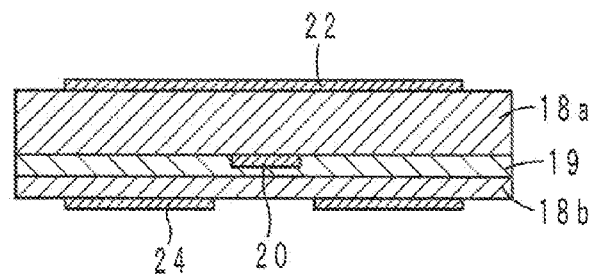

Next, a dielectric element assembly 12 is formed by stacking the dielectric sheet 18a, an adhesive layer 19, and the dielectric sheet 18b in this order, from the positive side to the negative side in the z-axis direction, as shown in FIGS. 9A and 9B, such that a plurality of openings 30 are positioned along the signal line 20, and the bottom surface of the dielectric sheet 18a and the top surface of the dielectric sheet 18b are opposite to each other. The dielectric sheet 18a, the adhesive layer 19, and the dielectric sheet 18b are heated and pressed from both the positive and negative sides in the z-axis direction, thus softening the adhesive layer 19 and integrating the dielectric sheet 18a, the adhesive layer 19, and the dielectric sheet 18b.

Figure 9C:
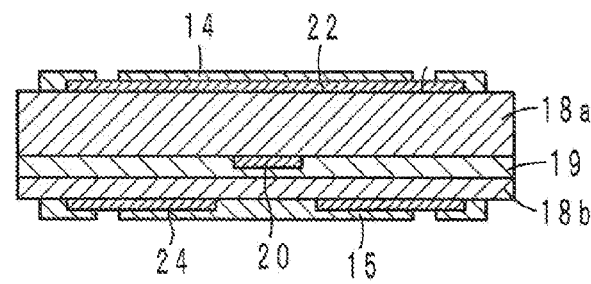

Next, a resin (resist) paste is applied to the top surface of the dielectric sheet 18a by screen printing, thus forming a protective layer 14 so as to cover the reference ground conductor 22, as shown in FIG. 9C. In addition, a resin (resist) paste is also applied to the bottom surface of the dielectric sheet 18b by screen printing, thus forming a protective layer 15 so as to cover the auxiliary ground conductor 24.

Figure 9D:
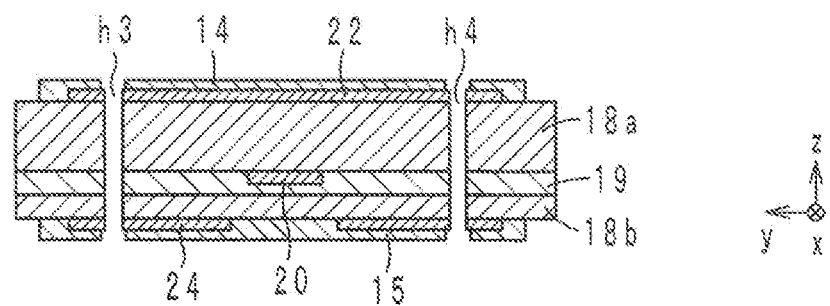
Figure 9E:
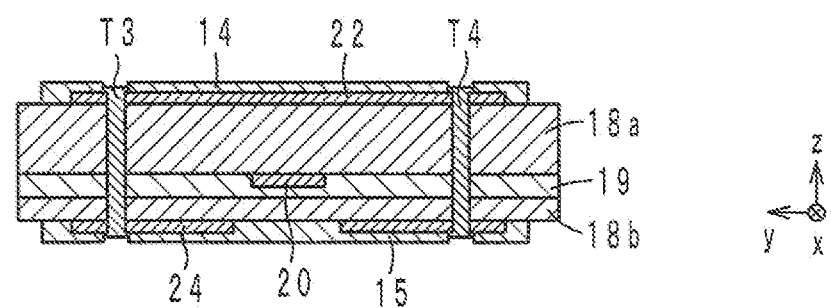

Next, as shown in FIG. 9D, through-holes h1 to h4 (only the through-holes h3 and h4 are shown) are provided by irradiating the dielectric sheet 18a, the adhesive layer 19, and the dielectric sheet 18b with laser beams where through-hole conductors T1 to T4 are to be formed. Thereafter, the through-holes h1 to h4 are filled with metal by Ni/Au plating, thus forming the through-hole conductors T1 to T4, as shown in FIG. 9E. As a result of the plating, Ni/Au plating films are formed also on the top surfaces of the external terminals 16a and 16b and terminal portions 22b and 22c.

Lastly, the connectors 100a and 100b are mounted on the connecting portions 12b and 12c by soldering them to the external terminals 16a and 16b and the terminal portions 22b and 22c, thus obtaining a laminated flat cable 10, as shown in FIG. 1.

The laminated flat cable 10 thus configured and the method for producing the same render it possible to significantly reduce or prevent variability in characteristic impedance of the signal line 20. More specifically, at the time of designing the laminated flat cable 10, the distance between the signal line 20 and the reference ground conductor 22 is decided such that the characteristic impedance of the signal line 20 is higher than a predetermined impedance value (e.g., about 50Ω) in a state where the reference ground conductor 22 is present but the auxiliary ground conductor 24 is not present. Thereafter, the shape of the opening 30 in the auxiliary ground conductor 24 and the distance between the signal line 20 and the auxiliary ground conductor 24 are decided such that the characteristic impedance of the signal line 20 has a predetermined impedance value (e.g., about 50Ω) in a state where the auxiliary ground conductor 24 is added.

Here, the characteristic impedance of the signal line 20 in the state where the reference ground conductor 22 is present but the auxiliary ground conductor 24 is not present is determined by the distance between the signal line 20 and the reference ground conductor 22. Accordingly, the laminated flat cable 10 is required to be produced such that the distance between the signal line 20 and the reference ground conductor 22 satisfies the range of design values.

Therefore, in the laminated flat cable 10, the signal line 20 is provided on the bottom surface of the dielectric sheet 18a. The reference ground conductor 22 with the openings 30 is provided on the top surface of the dielectric sheet 18a. That is, the signal line 20 and the reference ground conductor are provided on opposite principal surfaces of the same dielectric sheet 18a. Accordingly, the distance between the signal line 20 and the reference ground conductor 22 is kept the same as the thickness of the dielectric sheet 18a. That is, the distance between the signal line 20 and the reference ground conductor 22 can be set within the range of design values by designing the laminated flat cable 10 such that the dielectric sheet 18a after lamination satisfies the range of design values. Thus, it is possible to significantly reduce or prevent variability in characteristic impedance of the signal line 20.

Further, the laminated flat cable 10 and the method for producing the same render it possible to set the distance between the signal line 20 and the reference ground conductor 22 within the range of design values with accuracy. More specifically, in the case where the dielectric sheets are bonded under pressure without using the adhesive layer, the dielectric sheets are softened, and therefore, the distance between the signal line and the reference ground might vary depending on the heating and pressure conditions. On the other hand, as for the laminated flat cable 10 and the method for producing the same, since the adhesive layer 19 is used, the dielectric sheet 18a is not softened significantly. Therefore, the distance between the signal line 20 and the reference ground conductor 22 can be kept within the range of design values with accuracy. This is because the dielectric sheets 18a and 18b are bonded or joined by the adhesive layer 19 with the dielectric sheet 18a essentially not being softened.

Still further, in the laminated flat cable 10 and the method for producing the same, the signal line 20 and the reference ground conductor 22 are located on opposite principal surfaces of the dielectric sheet 18a. Accordingly, the accuracy of positioning the signal line 20 and the reference ground conductor 22 is determined by the processing accuracy for photolithography. In general, the processing accuracy for photolithography is extremely high, and therefore, the accuracy of positioning the signal line 20 and the reference ground conductor 22 is also extremely high. Thus, it is possible to significantly reduce or prevent the occurrence of misalignment between the signal line 20 and the reference ground conductor 22.

Yet further, the laminated flat cable 10 renders it possible to significantly reduce or prevent the occurrence of misalignment between the signal line 20 and the external terminals 16a and 16b. More specifically, in the laminated flat cable 10, the signal line 20 is located on the bottom surface of the dielectric sheet 18a. The external terminals 16a and 16b are located on the top surface of the dielectric sheet 18a. That is, the signal line 20 and the external terminals 16a and 16b are provided on opposite principal surfaces of the same dielectric sheet 18a. Accordingly, the accuracy of positioning the external terminals 16a and 16b and the signal line 20 is determined by the processing accuracy for photolithography. In general, the processing accuracy for photolithography is extremely high, and therefore, the accuracy of positioning the external terminals 16a and 16b and the signal line 20 is also extremely high. Moreover, the signal line 20 is prevented from being misaligned with the external terminals 16a and 16b due to the dielectric sheets 18a and 18b being misaligned during the lamination of the dielectric sheet 18a, the adhesive layer 19, and the dielectric sheet 18b. Thus, it is possible to significantly reduce or prevent the occurrence of breakage between the signal line 20 and the external terminals 16a and 16b and also prevent the characteristic impedance of the signal line 20 from deviating from a predetermined impedance value between the signal line 20 and the external terminals 16a and 16b.

Yet further, the laminated flat cable 10 includes the openings 30 provided in the auxiliary ground conductor 24, and therefore, the laminated flat cable 10 can be bent readily.

Yet further, the laminated flat cable 10 renders it possible to prevent the characteristic impedance of the signal line 20 from deviating from a predetermined impedance value (e.g., about 50Ω). The laminated flat cable 10 is used such that the top surface of the dielectric element assembly 12, which is located on the side of the reference ground conductor 22 relative to the signal line 20, contacts the battery pack 206. That is, the reference ground conductor 22, which is in the form of a solid without openings, rather than the auxiliary ground conductor 24 with the openings 30, is positioned between the signal line 20 and the battery pack 206. Therefore, it is possible to prevent the occurrence of electromagnetic field coupling between the signal line 20 and the battery pack 206. Thus, in the laminated flat cable 10, the characteristic impedance of the signal line 20 prevented from deviating from a predetermined impedance value.

Yet further, the laminated flat cable 10 renders it possible to reduce the thickness of the dielectric element assembly 12. More specifically, the auxiliary ground conductor 24 includes the openings 30 provided therein. The signal line 20 overlaps with the openings 30. Accordingly, little capacitance is generated between the signal line 20 and the auxiliary ground conductor 24. Therefore, it is possible to dispose the signal line 20 and the auxiliary ground conductor 24 close to each other while keeping the characteristic impedance of the signal line 20 at a predetermined impedance value (e.g., about 50Ω). Thus, the laminated flat cable 10 can be reduced in thickness. The thinner the laminated flat cable 10 becomes, the more readily the laminated flat cable 10 can be bent.

Yet further, in the laminated flat cable 10, the auxiliary ground conductor 24 is covered by the protective layer 15. Accordingly, the auxiliary ground conductor 24 is not exposed from the bottom surface of the dielectric element assembly 12. Therefore, even if another component is disposed on the bottom surface of the dielectric element assembly 12, the auxiliary ground conductor 24 is not directly opposed to that component, so that the characteristic impedance of the signal conductor 20 is inhibited from fluctuating.

First Modification

Figure 10:
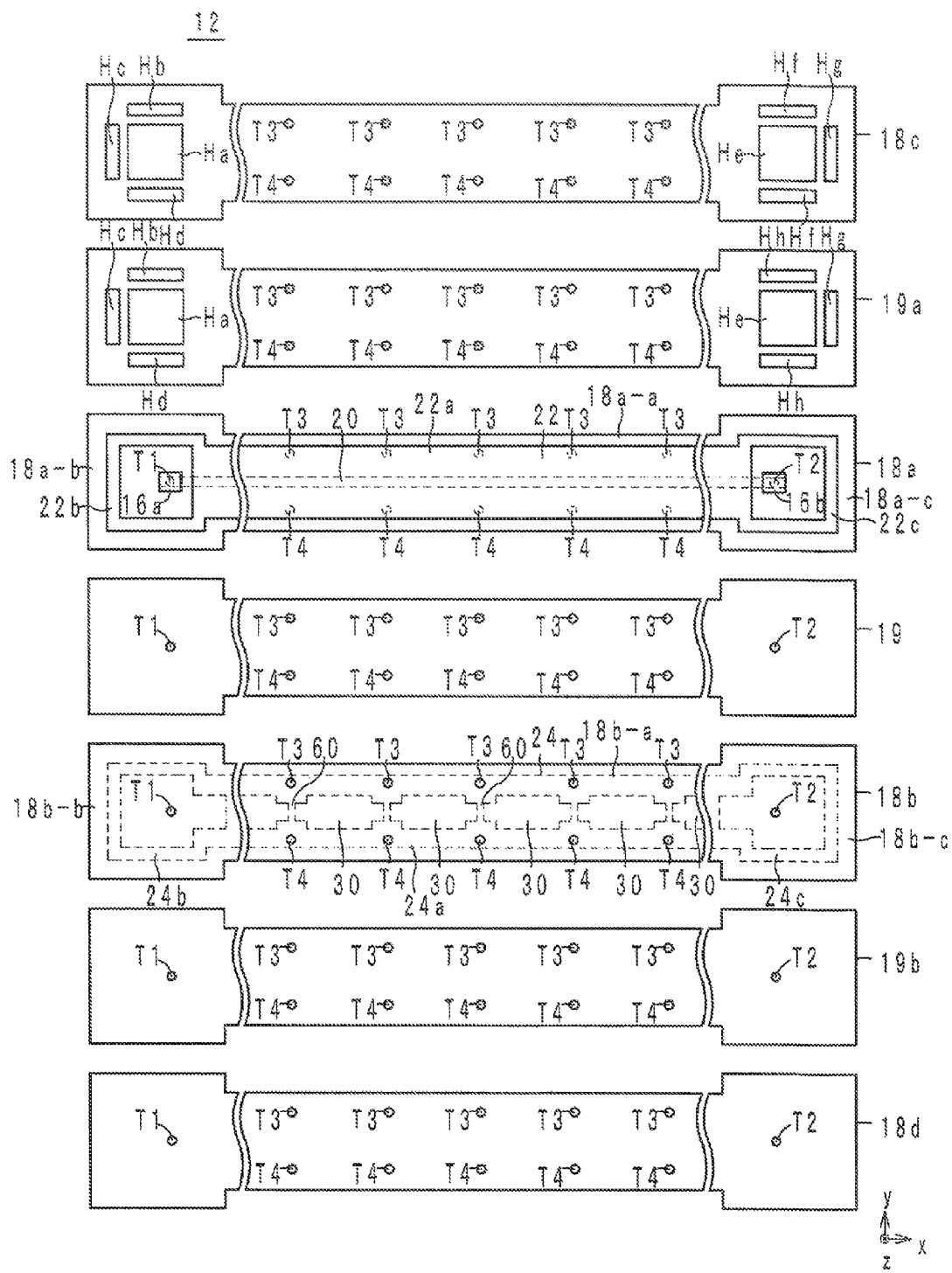
FIG. 10 is an exploded view of a dielectric element assembly of a laminated flat cable according to a first modification of a preferred embodiment of the present invention.
Figure 14:
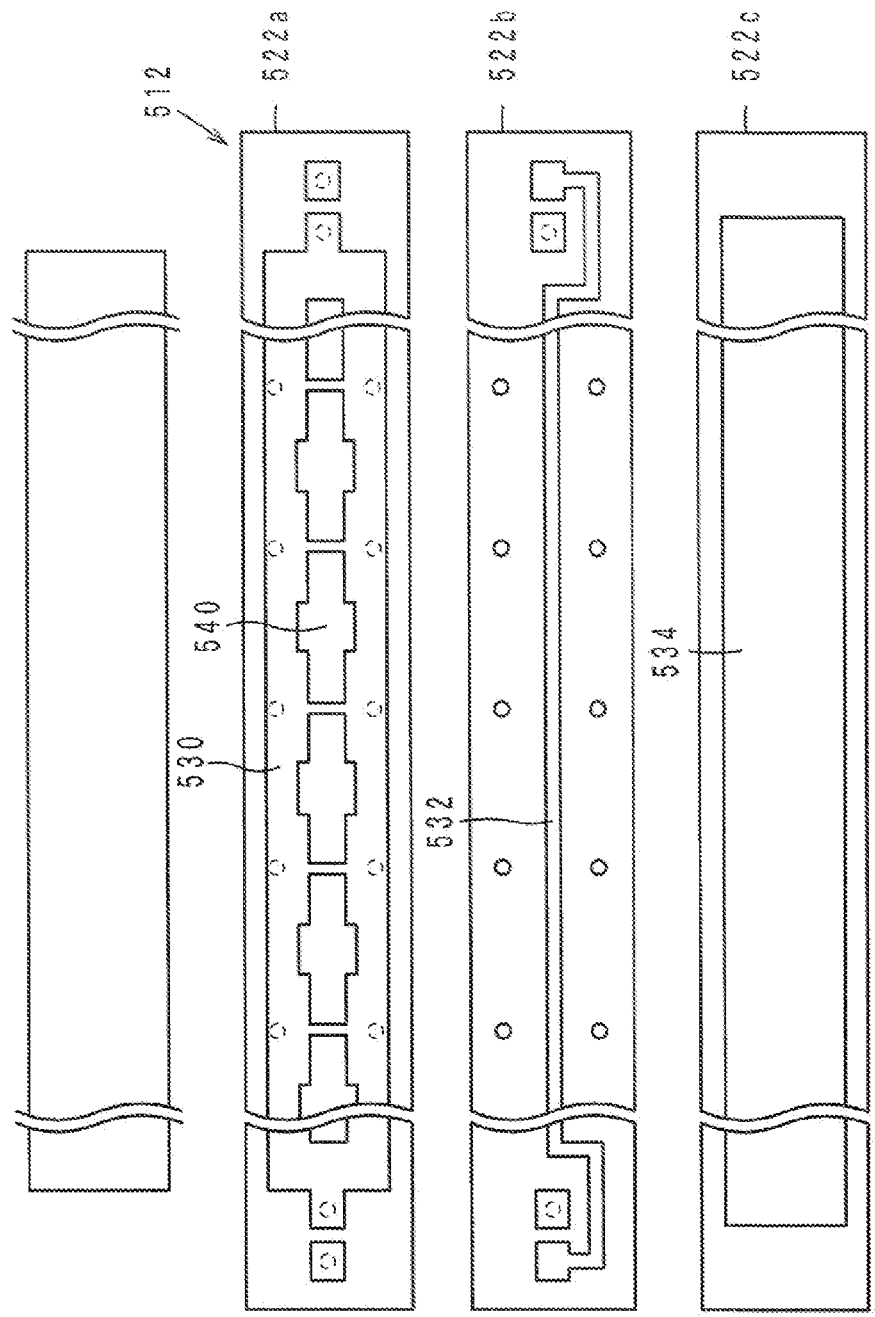
FIG. 14 is an exploded view of a high-frequency signal line described in Japanese Utility Model No. 3173143.

Hereinafter, the configuration of a laminated flat cable according to a first modification of a preferred embodiment of the present invention will be described with reference to the drawings. FIG. 10 is an exploded view of a dielectric element assembly 12 of the laminated flat cable 10a according to the first modification.

The laminated flat cable 10a differs from the laminated flat cable 10 in that dielectric sheets 18c and 18d and adhesive layers 19a and 19b are provided in place of the protective layers 14 and 15.

More specifically, the adhesive layer 19a is laminated on the positive side of the dielectric sheet 18a in the z-axis direction. In addition, the dielectric sheet 18c is laminated on the positive side of the adhesive layer 19a in the z-axis direction. The dielectric sheet 18c and the adhesive layer 19a include the same openings Ha to Hh as those provided in the protective layer 14. Accordingly, the external terminals 16a and 16b and the terminal portions 22b and 22c are exposed therefrom.

Further, the adhesive layer 19b is laminated on the negative side of the dielectric sheet 18b in the z-axis direction. In addition, the dielectric sheet 18d is laminated on the negative side of the adhesive layer 19b in the z-axis direction.

The laminated flat cable 10a thus configured achieves the same effects as those achieved by the laminated flat cable 10.

Further, the dielectric sheets 18c and 18d are preferably made of polyimide or liquid crystal polymer and have higher strength than the protective layers 14 and 15, which are preferably made of a resist material. Therefore, the laminated flat cable 10a provides improved strength of the dielectric element assembly 12.

Second Modification

Hereinafter, the configuration of a laminated flat cable according to a second modification of a preferred embodiment of the present invention will be described with reference to the drawings. FIG. 11 is a cross-sectional structure view of the laminated flat cable 10b according to the second modification.

The laminated flat cable 10b differs from the laminated flat cable 10 in the structure of the through-hole conductors T1 to T4. More specifically, in the laminated flat cable 10b, the through-hole conductors T1 to T4 have a hollow structure not filled with a conductive material. The through-hole conductors T1 to T4 are provided by coating the inner circumferential surfaces of through-holes with a metal film by plating.

The through-hole conductors T1 to T4 of the laminated flat cable 10b can be changed in shape more readily than the through-hole conductors T1 to T4 of the laminated flat cable 10. Accordingly, the laminated flat cable 10b can be changed in shape more readily than the laminated flat cable 10.

Third Modification

Hereinafter, the configuration of a laminated flat cable according to a third modification of a preferred embodiment of the present invention will be described with reference to the drawings. FIG. 12 is a plan view of a signal line 20 and an auxiliary ground conductor 24 of the laminated flat cable 10c according to the third modification as seen in the direction of lamination.

The laminated flat cable 10c differs from the laminated flat cable 10 in the shapes of the signal line 20 and the opening 30.

More specifically, the opening 30 is tapered in the area A3. Moreover, the width W11 of the signal line 20 in the area A1 is greater than the width W12 of the signal line 20 in the area A2. In addition, the signal line 20 is tapered in the area A3 so as to be narrower toward the area A2.

In the laminated flat cable 10d, the distance between the signal line 20 and the reference ground conductor 24 in the area A3 decreases gradually in the direction from the area A1 toward the area A2. Accordingly, the capacitance generated between the signal line 20 and the reference ground conductor 22 in the area A3 increases gradually in the direction from the area A1 toward the area A2. Thus, the characteristic impedance Z3 of the signal line 20 in the area A3 is prevented from changing abruptly, thus significantly reducing or preventing the occurrence of high-frequency signal reflection in the signal line 20.

Furthermore, the width W12 of the signal line 20 in the area A2 is less than the width W11 of the signal line 20 in the area A1. Accordingly, the capacitance generated between the signal line 20 and the bridge portion 60 is prevented from becoming excessively high. Thus, the characteristic impedance Z2 of the signal line 20 in the area A2 is prevented from becoming excessively low.

Fourth Modification

Hereinafter, the configuration of a laminated flat cable according to a fourth modification of a preferred embodiment of the present invention will be described with reference to the drawings. FIG. 13 is an exploded view of a dielectric element assembly 12 of the laminated flat cable 10d according to the fourth modification.

The laminated flat cable 10d differs from the laminated flat cable 10 in that the adhesive layer 19 is not provided. Accordingly, the dielectric sheets 18a and 18b are laminated such that the bottom surface of the dielectric sheet 18a contacts the top surface of the dielectric sheet 18b. At the time of the lamination, the dielectric sheets 18a and 18b are heated so that the bottom surface of the dielectric sheet 18a and the top surface of the dielectric sheet 18b are softened and fused, such that the dielectric sheets 18a and 18b are bonded.

Note that the laminated flat cable 10d has via-hole conductors B1 to B6 provided in place of the through-hole conductors T1 to T4. More specifically, the via-hole conductor B1 pierces through the dielectric sheet 18a in the z-axis direction, and connects the external terminal 16a to the end of the signal line 20 that is located on the negative side in the x-axis direction. The via-hole conductor B2 pierces through the dielectric sheet 18a in the z-axis direction, and connects the external terminal 16b to the end of the signal line 20 that is located on the positive side in the x-axis direction.

Further, the via-hole conductors B3 pierce through the line portion 18a-a of the dielectric sheet 18a in the z-axis direction, and are positioned on the positive side in the y-axis direction relative to the signal line 20. The via-hole conductors B5 pierce through the line portion 18b-a of the dielectric sheet 18b in the z-axis direction, and are positioned on the positive side in the y-axis direction relative to the signal line 20. The via-hole conductors B3 and B5 are connected to each other, such that each pair constitutes a single via-hole conductor, thus connecting the reference ground conductor 22 and the auxiliary ground conductor 24.

Still further, the via-hole conductors B4 pierce through the line portion 18a-a of the dielectric sheet 18a in the z-axis direction, and are positioned on the negative side in the y-axis direction relative to the signal line 20. The via-hole conductors B6 pierce through the line portion 18b-a of the dielectric sheet 18b in the z-axis direction, and are positioned on the negative side in the y-axis direction relative to the signal line 20. The via-hole conductors B4 and B6 are connected to each other, such that each pair constitutes a single via-hole conductor, thus connecting the reference ground conductor 22 and the auxiliary ground conductor 24.

The laminated flat cable 10d thus configured achieves the same effects as those achieved by the laminated flat cable 10.

Further, the laminated flat cable 10d does not require the adhesive layer 19, and therefore, the dielectric element assembly 12 is reduced in thickness.

Still further, since the laminated flat cable 10d does not include the adhesive layer 19 in which no via-hole conductors are formable, the via-hole conductors B1 to B6 can be used in place of the through-hole conductors T1 to T4. Accordingly, the via-hole conductors B1 to B6 are not exposed from the top surface of the flat cable 10d. Thus, the via-hole conductors B1 to B6 are prevented from being corroded. In addition, the via-hole conductors B1 to B6 are prevented from being dissolved in a plating solution at the time of plating the external terminals 16a and 16b.

Other Preferred Embodiments

The present invention is not limited to the laminated flat cables 10 and 10a to 10d according to the above preferred embodiments, and variations can be made within the spirit and scope of the present invention.

The protective layers 14 and 15 have been described as being formed preferably by screen printing, but they may be formed by photolithography, for example.

Further, the reference ground conductor 22 has been described as preferably being in the form of a solid without openings, but it may include openings provided therein. However, in such a case, the opening in the reference ground conductor 22 is smaller in area than the opening in the auxiliary ground conductor 24.

Still further, in the laminated flat cables 10 and 10a to 10c, the auxiliary ground conductor 24 may be provided on the top surface of the dielectric sheet 18b.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated flat cable, comprising:
    a laminate including a first base layer including first and second principal surfaces and a second base layer including third and fourth principal surfaces, the second principal surface being opposed to the third principal surface;
    a signal line located on the second principal surface;
    a reference ground conductor located on the first principal surface and being opposite to the signal line; and
    an auxiliary ground conductor located on the third or fourth principal surface and being opposite to the signal line; wherein
    the auxiliary ground conductor includes a plurality of openings arranged along the signal line; and
    the first base layer is thicker than the second base layer.

2. The laminated flat cable according to claim 1, wherein,
    the auxiliary ground conductor is located on the fourth principal surface; and
    the first base layer and the second base layer are laminated such that the second and third principal surfaces contact each other.

3. The laminated flat cable according to claim 1, wherein the reference ground conductor is a solid without openings.

4. The laminated flat cable according to claim 1, wherein the signal line has a tapered shape.

5. The laminated flat cable according to claim 1, further comprising:
    external terminal arranged on the first principal surface so as to overlap with opposite one end of the signal line when viewed in a direction of lamination; and
    inter-layer connecting portion piercing through the first base layer in the direction of lamination and connecting the signal line and the external terminal.

6. The laminated flat cable according to claim 5, wherein the inter-layer connecting portions include through hole conductors.

7. The laminated flat cable according to claim 6, wherein the through hole conductors are filled with metal.

8. The laminated flat cable according to claim 1, wherein the laminate further includes an adhesive layer bonding the first base layer and the second base layer.

9. The laminated flat cable according to claim 8, wherein the laminate includes protective layers on the first and second base layers.

10. The laminated flat cable according to claim 8, wherein the laminate includes adhesive layers on the first and second base layers.

11. A laminated flat cable, comprising:
    a laminate including a first base layer including first and second principal surfaces and a second base layer including third and fourth principal surfaces, the second principal surface being opposed to the third principal surface;
    a signal line located on the second principal surface;
    a reference ground conductor located on the first principal surface and being opposite to the signal line; and
    an auxiliary ground conductor located on the third or fourth principal surface and being opposite to the signal line; wherein
    the auxiliary ground conductor includes a plurality of openings arranged along the signal line;
    a surface roughness of the signal line is greater on a side of the signal line that contacts the second principal surface than on a side of the signal line that does not contact the second principal surface; and
    a surface roughness of the reference ground conductor is greater on a side of the reference ground conductor that contacts the first principal surface than on a side of the reference ground conductor that does not contact the first principal surface.

* * * * *